(12) United States Patent
Sohn et al.

(10) Patent No.: US 7,843,239 B2
(45) Date of Patent: Nov. 30, 2010

(54) DIVIDING CIRCUIT AND PHASE LOCKED LOOP USING THE SAME

(75) Inventors: Young-Soo Sohn, Gunpo-si (KR); Kwang-Il Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/318,385

(22) Filed: Dec. 29, 2008

(65) Prior Publication Data
US 2009/0167384 A1 Jul. 2, 2009

(30) Foreign Application Priority Data
Jan. 2, 2008 (KR) .................... 10-2008-0000183

(51) Int. Cl.
*H03L 7/06* (2006.01)
(52) U.S. Cl. ...................................... 327/156; 327/147
(58) Field of Classification Search .................. 327/147, 327/156
See application file for complete search history.

(56) References Cited

U.S. PATENT DOCUMENTS

| | | | | | |
|---|---|---|---|---|---|
| 4,672,299 | A | * | 6/1987 | Grimes et al. ................ | 323/217 |
| 5,754,615 | A | * | 5/1998 | Colavin ........................ | 377/47 |
| 5,825,253 | A | * | 10/1998 | Mathe et al. .................. | 331/18 |
| 5,834,987 | A | * | 11/1998 | Dent ........................... | 332/127 |
| 6,150,891 | A | * | 11/2000 | Welland et al. ............... | 331/25 |
| 6,317,006 | B1 | * | 11/2001 | Welland et al. ............... | 331/25 |

(Continued)

FOREIGN PATENT DOCUMENTS

JP 08-331009 12/1996

(Continued)

OTHER PUBLICATIONS

Abstract of KR 10-2006-0056085 published May 24, 2006 which corresponds to KR 10-0665008.

*Primary Examiner*—Lincoln Donovan
*Assistant Examiner*—Adam D Houston
(74) *Attorney, Agent, or Firm*—Harness, Dickey & Pierce (57) ABSTRACT

The PLL includes a selection signal generator configured to output a selection signal varying in response to a first clock signal, and a first dividing circuit configured to divide an externally input reference clock signal by a division ratio and output a first division signal. The first dividing circuit selects one of a plurality of edges of the reference clock signal applied for at least one cycle of the first division signal in response to the selection signal, and synchronizes and generates the first division signal on the basis of the selected edge of the reference clock signal. A second dividing circuit is configured to receive an output clock signal, divide the output clock signal by a division ratio, and output a second division signal. The second dividing circuit selects one of the edges of the reference clock signal applied for at least one cycle of the second division signal in response to the selection signal, and synchronizes and generates the second division signal on the basis of the selected edge of the reference clock signal. A synchronous signal output portion is configured to detect a phase difference between the first and second division signals, generate a control voltage corresponding to the phase difference, and output the output clock signal having a frequency corresponding to the control voltage.

13 Claims, 4 Drawing Sheets

U.S. PATENT DOCUMENTS

| | | | |
|---|---|---|---|
| 6,741,846 B1 * | 5/2004 | Welland et al. | 455/260 |
| 6,779,142 B1 * | 8/2004 | Bhavsar et al. | 714/726 |
| 6,885,227 B2 * | 4/2005 | Agrawal et al. | 327/156 |
| 6,940,359 B2 * | 9/2005 | Ishii | 331/185 |
| 7,034,599 B1 * | 4/2006 | Agrawal et al. | 327/291 |
| 7,042,973 B2 * | 5/2006 | Kuroki | 377/47 |
| 7,071,743 B2 * | 7/2006 | Starr | 327/147 |
| 7,126,430 B2 * | 10/2006 | Oba et al. | 331/11 |
| 7,158,443 B2 * | 1/2007 | Lin | 365/189.07 |
| 7,415,092 B2 * | 8/2008 | Itri | 375/376 |
| 7,511,581 B2 * | 3/2009 | Lee et al. | 331/34 |
| 7,548,101 B2 * | 6/2009 | Shim | 327/175 |
| 7,573,303 B1 * | 8/2009 | Chi et al. | 327/105 |
| 7,649,420 B2 * | 1/2010 | Chuang | 331/1 R |
| 2007/0132515 A1 * | 6/2007 | Lee et al. | 331/1 A |
| 2009/0039968 A1 * | 2/2009 | Thomsen et al. | 331/10 |
| 2009/0061804 A1 * | 3/2009 | Chang et al. | 455/260 |
| 2009/0268859 A1 * | 10/2009 | Sun et al. | 375/376 |
| 2009/0273378 A1 * | 11/2009 | Mangnall et al. | 327/156 |
| 2010/0123491 A1 * | 5/2010 | Palmer et al. | 327/156 |
| 2010/0134157 A1 * | 6/2010 | Kawashima | 327/156 |

FOREIGN PATENT DOCUMENTS

| | | |
|---|---|---|
| JP | 10-065526 | 3/1998 |
| KR | 10-1999-0019530 | 3/1999 |
| KR | 10-0665008 | 1/2007 |

* cited by examiner

DIVIDING CIRCUIT AND PHASE LOCKED LOOP USING THE SAME

CROSS-REFERENCE TO RELATED APPLICATION

This application claims the benefit of Korean Patent Application No. 10-2008-0000183, filed Jan. 2, 2008, the contents of which are hereby incorporated herein by reference in their entirety.

BACKGROUND

1. Field

Example embodiments relate to a dividing circuit, and more particularly, to a dividing circuit, which can improve its own stability against noise in a phase locked loop (PLL), and a PLL using the dividing circuit.

2. Description of Related Art

In general, it is necessary to control discrete apparatuses or electronic circuits on a computer system or a chip in response to a single reference signal. Therefore, a synchronization circuit for generating an internal clock signal in synchronization with an external reference signal may be designed and embedded on the computer system or chip. A typical example of the synchronization circuit may be a phase locked loop (PLL).

The PLL may detect a phase difference between an input signal and an output signal, outputted from a voltage controlled oscillator (VCO), and determine the frequency and phase of the output signal. In particular, a conventional PLL periodically generates a division input signal based on a same specific edge of an input signal, and compares the output signal with the division input signal to generate an output signal based on the division input signal. The PLL may be widely used to synchronize the frequency of the input signal with that of the output signal

SUMMARY

According to example embodiments, a dividing circuit includes a number of division output units connected in cascade. Each of the division output units includes a divider configured to output a positive output signal and a negative output signal corresponding to an inverse of the positive output signal. The positive output signal is obtained by dividing an input signal or a positive output signal of a previous division output unit by a division ratio. Each division output unit also includes a multiplexer (MUX) configured to select and output one of the positive output signal and the negative output signal in response to a selection signal. The dividing circuit divides the input signal and outputs a division signal, selects one of a plurality of edges of the input signal applied during at least one cycle of the division signal in response to the selection signal, and synchronizes and generates the division signal on the basis of the selected edge of the input signal.

A 1-bit random signal may be applied as the selection signal to each of MUXs of the division output units.

The divider may be a flip-flop.

According to another example embodiment, a PLL include a selection signal generator configured to output a selection signal varying in response to a first clock signal. A first dividing circuit is configured to divide an input clock signal by a first division ratio and output a first division signal. Here, the first dividing circuit selects one of a plurality of edges of the input clock signal applied during the at least one cycle of the first division signal in response to the selection signal, and synchronizes the first division signal on the basis of the selected edge of the input clock signal. A second dividing circuit is configured to receive an output clock signal, divide the output clock signal by second division ratio, and output a second division signal. The second dividing circuit selects one of the edges of the output clock signal applied for at least one cycle of the second division signal in response to the selection signal, and synchronizes the second division signal on the basis of the selected edge of the output clock signal. A synchronous signal output portion is configured to detect a phase difference between the first and second division signals, generate a control voltage corresponding to the phase difference, and output the output clock signal having a frequency corresponding to the control voltage. The first division ratio and the second division ratio may be the same.

According to a further example embodiment, a PLL method may include generating at least one selection signal in response to a first clock signal, receiving an input clock signal and an output clock signal, dividing the input clock signal and the output clock signal by respective division ratios, and outputting divided signals. Each one of a plurality of edges of the input clock signal and the output clock signal that are respectively applied during at least one cycle of each of the divided signals is selected in response to the selection signal, and the divided signals are output in synchronization with the selected edges of the input clock signal and the output clock signal, respectively. A phase difference between the output divided signals is detected, and a control voltage corresponding to the phase difference is generated. The output clock signal corresponding to the control voltage is generated, and the output clock signal is synchronized with a frequency and phase of the input clock signal.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION OF THE EMBODIMENTS

Example embodiments will now be described more fully with reference to the accompanying drawings. However, example embodiments may be embodied in many different forms and should not be construed as being limited to the example embodiments set forth herein. Example embodiments are provided so that this disclosure will be thorough, and will fully convey the scope to those who are skilled in the art. In some example embodiments, well-known processes, well-known device structures, and well-known technologies are not described in detail to avoid the unclear interpretation of the example embodiments. Throughout the specification, like reference numerals in the drawings denote like elements.

It will be understood that when an element or layer is referred to as being "on", "connected to" or "coupled to" another element or layer, it may be directly on, connected or coupled to the other element or layer, or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
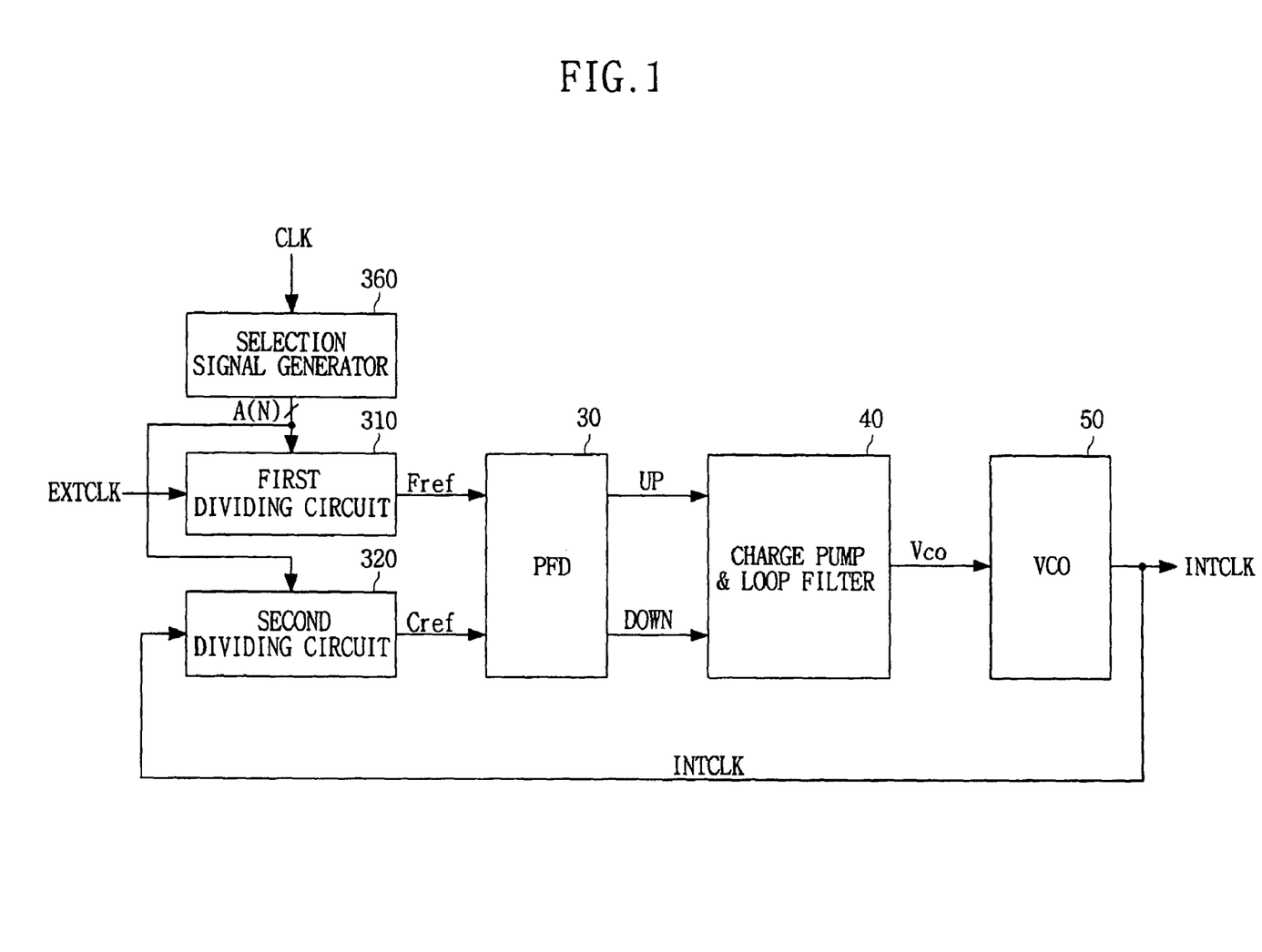
FIG. 1 is a block diagram of a PLL according to example embodiments.

FIG. 1 is a block diagram of a PLL according to example embodiments.

Referring to FIG. 1, the PLL may include a first dividing circuit 310, a second dividing circuit 320, a phase frequency detector (PFD) 30, a charge pump and loop filter 40, a voltage controlled oscillator (VCO) 50, and a selection signal generator 360.

The construction of the PLL of FIG. 1 will now be described.

The selection signal generator 360 may generate at least a 1-bit selection signal A(N) in response to a low-frequency selection clock signal CLK and output the selection signal A(N) to the first and second dividing circuits 310 and 320. The low-frequency selection clock signal CLK may have a lower frequency than that of the external clock signal EXTCLK.

The first dividing circuit 310 may divide the external clock signal EXTCLK by a first division ratio and output a division frequency signal Fref. In this case, the first dividing circuit 310 may generate and output the division frequency signal Fref, which leads or trails a phase of a previous division frequency signal Fref, in response to the selection signal A(N) generated by the selection signal generator 360.

The second dividing circuit 320 may receive an internal clock signal INTCLK, which is an output signal of the VCO 50, divide the internal clock signal INTCLK by a second division ratio, and output a comparison frequency signal Cref with the same frequency as the division frequency signal Fref. In this case, the second dividing circuit 320 may generate and output the comparison frequency signal Cref, which leads or trails a previous comparison frequency signal Cref, in response to the selection signal A(N) generated by the selection signal generator 360. The first division ratio and the second division ratio may be the same or different.

The PFD 30 may receive the first division frequency signal Fref, which is an output signal of the first dividing circuit 310, and the comparison frequency signal Cref, which is an output signal of the second dividing circuit 320. The PFD 30 compares the division frequency signal Fref with the comparison frequency signal Cref, and generates as output an up signal or a down signal corresponding to a phase difference between the two signals.

The charge pump and loop filter 340 may receive the up signal or down signal output by the PFD 30, generate a sourcing current or a sinking current in response to the up signal or down signal, generate a control voltage Vco according to the generated amount of the sourcing current or sinking current, and apply the control voltage Vco to the VCO 50. In this case, the generated control voltage Vco may be made to pass through a low pass filter (LPF) to remove partial noise.

The VCO 50 may receive the control voltage Vco from the charge pump and loop filter 340 and output the internal clock signal INTCLK with a frequency corresponding to the control voltage Vco in synchronization with the external clock signal EXTCLK.

The PFD 30, the charge pump and loop filter 340 and the VCO 50 may be referred to as a synchronous signal output portion that detects a phase difference between the two signals, Fref and Cref, generates the control voltage Vco corresponding to the phase difference, and outputs the output clock signal corresponding to the control voltage Vco.

Figure 2:
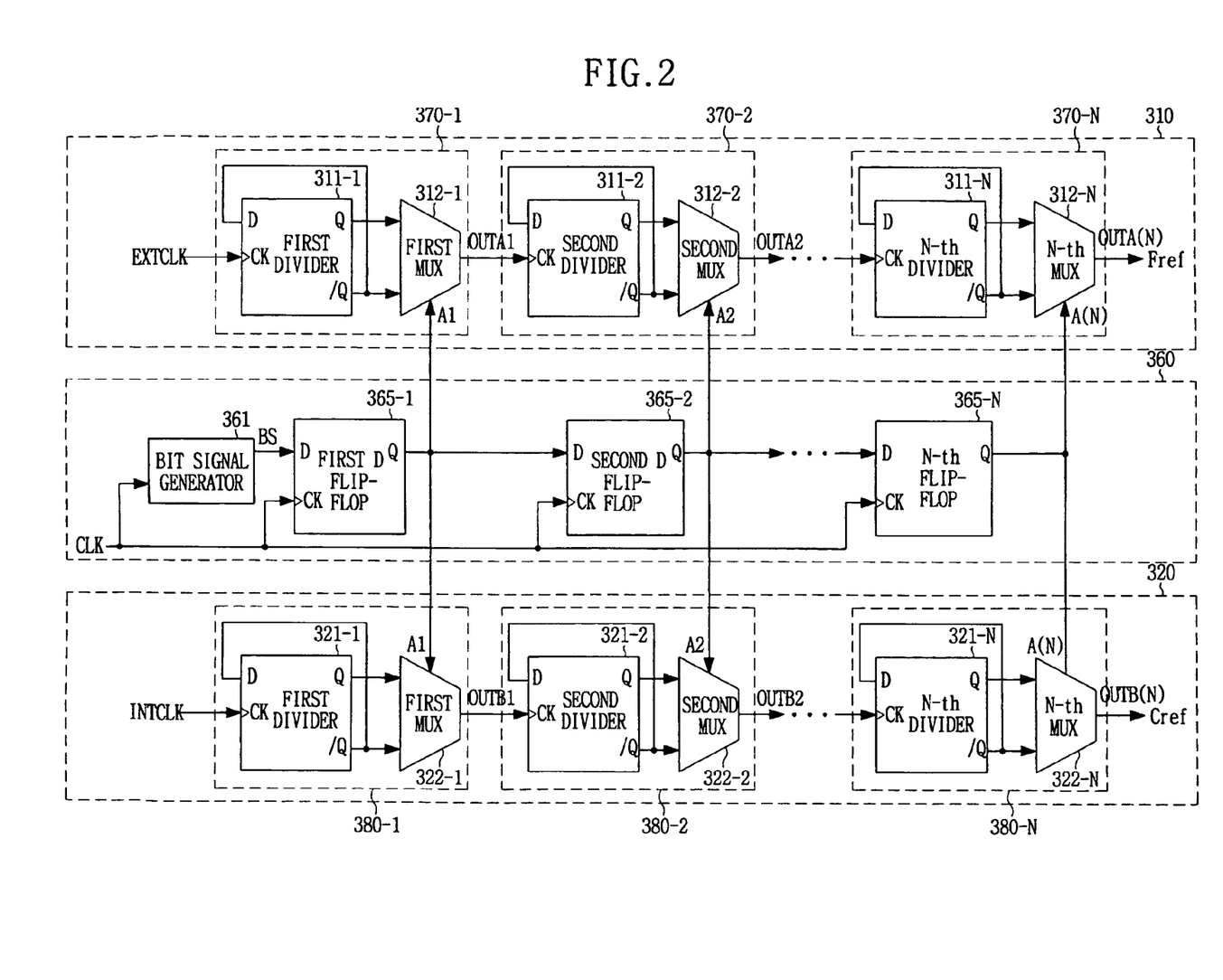
FIG. 2 is a detailed view of a selection signal generator, a first dividing circuit, and a second dividing circuit shown in FIG. 1.

FIG. 2 is a detailed view of the selection signal generator, the first dividing circuit, and the second dividing circuit shown in FIG. 1.

Referring to FIG. 2, the first dividing circuit 310 may include a first divider 311-1, a first multiplexer (MUX) 312-1, a second divider 311-2, a second MUX 312-2, . . . , an N-th divider 311-N, and an N-th MUX 312-N. As shown, each pair of divider 311-1, . . . , 311-N and MUX 312-1, . . . , 312-N forms each division output unit 370-1, . . . , 370-N.

The second dividing circuit 320 may include a first divider 321-1, a first MUX 322-1, a second divider 321-2, a second MUX 322-2, . . . , an N-th divider 321-N, and an N-th MUX 322-N. As shown, each pair of divider 321-1, . . . , 321-N and MUX 322-1, . . . , 322-N forms each division output unit 380-1, . . . , 380-N. Also, the selection signal generator 360 may include a bit signal generator 361, a first D flip-flop 365-1, a second D flip-flop 365-2, . . . , and an N-th D flip-flop 365-N.

The first and second dividing circuits 310 and 320 have the same structure and perform the same operations except that the first dividing circuit 310 divides an external clock signal EXTCLK, while the second dividing circuit 320 divides an internal clock signal INTCLK. Thus, only a description of the first dividing circuit 310 will be presented.

The construction of the selection signal generator 360 and the first dividing circuit 310 shown in FIG. 2 will now be described.

The first dividing circuit 310 may include at least one division output unit connected in cascade. Each of the division output units may include a divider and a MUX.

The first divider 311-1 may output a positive output signal Q obtained by 1/2-dividing an external clock signal EXTCLK and a negative output signal /Q obtained by inverting the positive output signal Q.

The first MUX 312-1 may receive the positive output signal Q and the negative output signal /Q from the first divider 311-1, select one of the positive output signal Q and the negative output signal /Q in response to a first selection signal A1 from the selection signal generator 360, and output the selected signal as a first division output signal OUTA1.

The second divider 311-2 may receive the first division output signal OUTA1 from the first MUX 312, 1/2-divide the first division output signal OUTA1, and output a positive output signal Q and a negative output signal /Q.

The second MUX 312-2 may receive the positive output signal Q and the negative output signal /Q from the second divider 311-2, select one of the positive output signal Q and the negative output signal /Q in response to a second selection signal A2 of the selection signal generator 360, and output the selected signal as a second division output signal OUTA2.

This structure and operation continues for each pair of divider and MUX such that the N-th divider 315 may receive an N-1-th division output signal OUTA(N-1) from an N-1-th MUX (not shown), 1/2-divide the N-1-th division output signal OUTA(N-1), and output a positive output signal Q and a negative output signal /Q.

The N-th MUX 312-N may select one of the positive output signal Q and the negative output signal /Q of the N-th divider 311-N in response to an N-th selection signal A(N) of the selection signal generator 360 and output the selected signal as an N-th division output signal OUTA(N).

Although each of the dividers 311-1, 311-2, . . . , 311-N may include various circuits, it is assumed for brevity that each of the dividers 311-1, 311-2, . . . , 311-N according to the present example embodiment includes a typical D flip-flop. Thus, when an input terminal D and an inverted output terminal /Q of a D flip-flop are connected with each other and a clock signal is applied to a clock input terminal CK of the D flip-flop, a 1/2-divided signal may be generated through an output terminal Q of the D flip-flop.

Accordingly, the first dividing circuit 310 may include a number N of dividers and output a first division output signal OUTA(N) obtained by $1/2^N$-dividing an external clock signal EXTCLK. There, the first division output signal OUTA(N) is the division frequency signal Fref. Also, the second dividing circuit 320 may include a number N of dividers and output a second division output signal OUTB(N) obtained by $1/2^N$-dividing an internal clock signal INTCLK. There, the second division output signal OUTB(N) is the comparison frequency signal Cref.

Figure 3:
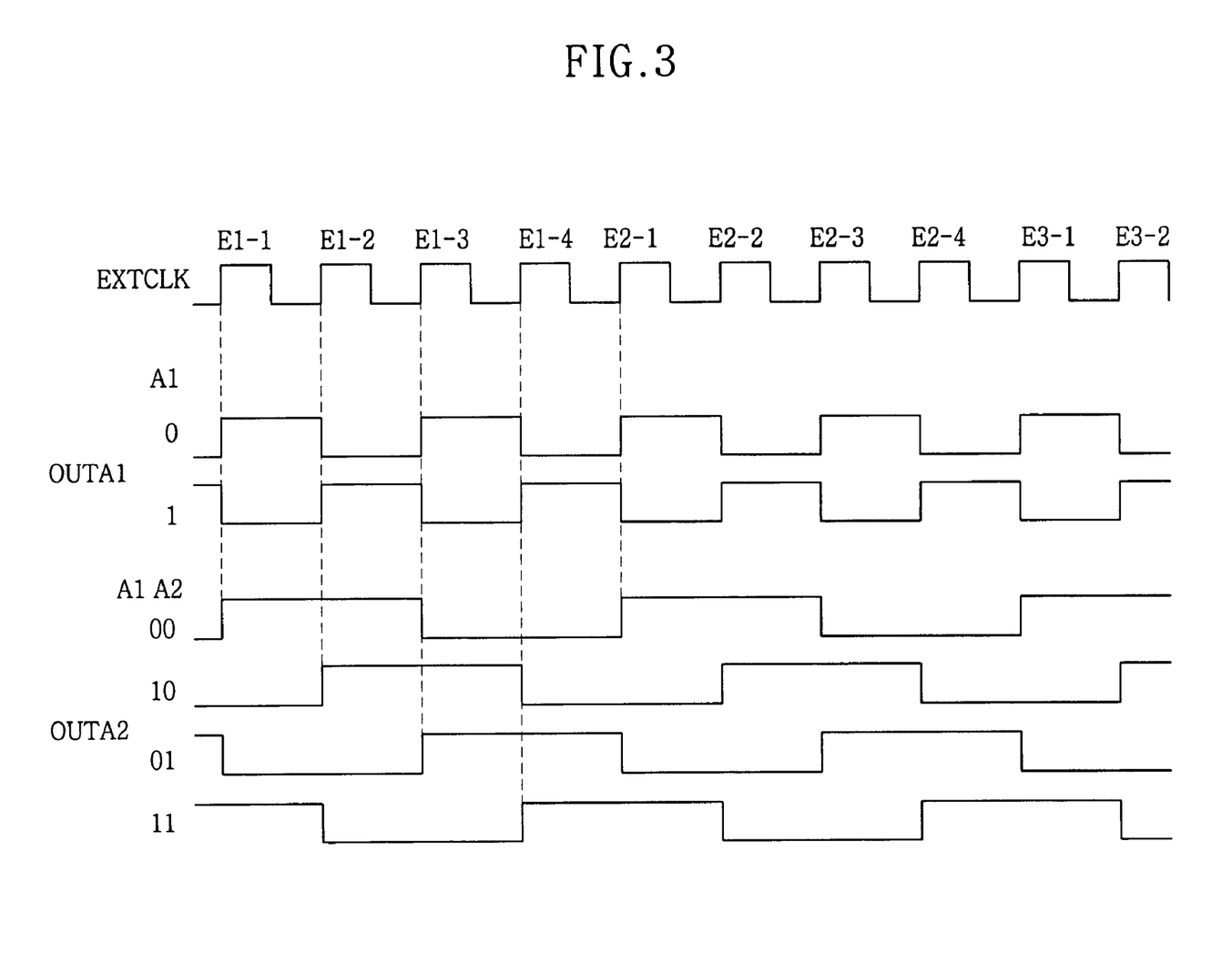
FIG. 3 is a signal waveform diagram showing output signals of the first dividing circuit in response to a selection signal generated by the selection signal generator of FIG. 2.

Assuming that the external clock signal EXTCLK has the same frequency as the internal clock signal INTCLK, FIG. 3 illustrates that the first and second dividing circuits 310 and 320 include equal numbers of dividers and MUXs. However, when the external clock signal EXTCLK has a different frequency from the internal clock signal INTCLK, the first and second dividing circuits 310 and 320 may have different numbers of dividers and MUXs. That is, it is obvious that the first dividing circuit 310 may include a number N of dividers and a number N of MUXs, and the second dividing circuit 320 may include a number M of dividers and a number M of MUXs. Thus, the division ratios of the first dividing circuit 310 and the second dividing circuit 320 may be different from each other.

The selection signal generator includes a bit signal generator 361, and a plurality of flip-flops 365-1 through 365-N. The bit signal generator 361 may generate and output a 1-bit bit signal BS, which has '0' and '1' non-sequentially, in response to a low-frequency selection clock signal CLK.

The first D flip-flop 365-1 may receive the bit signal BS from the bit signal generator 361 and output a first selection signal A1 to the first MUX 312-1 and the second D flip-flop 365-2.

The second D flip-flop 365-2 may receive the first selection signal A1 from the first D flip-flop 365-1 in response to the selection signal CLK and output a second selection signal A2 to the second MUX 312-2 and a third D flip-flop (not shown).

The N-th flip-flop 365-N may receive an N-1-th selection signal A(N-1) from an N-1-th D flip-flop (not shown) in response to the selection clock signal CLK and output an N-th selection signal A(N) to the N-th MUX 312-N.

Accordingly, the bit signal generator 361 of the selection signal generator 360 may output the bit signal BS in response to the selection clock signal CLK, and a plurality of D flip-flops 365-1 through 365-N, which are connected in series, may receive the bit signal BS in response to the selection clock signal CLK, output and shift the bit signal BS to next-stage D-flip-flops, and change selection signals A1 to A(N), which are being output to a plurality of MUXs of the first and second dividing circuits 310 and 320 at the same time, into present output signals.

Alternatively, the selection signal generator 360 may not include a plurality of D flip-flops, and instead include the bit signal generator 361' for outputting a plurality of 1-bit selection signals A1 to A(N), each of which has '0' and '1' non-sequentially, to directly control the MUXs of the first and second dividers 310 and 320.

FIG. 3 is a signal waveform diagram showing output signals of the first dividing circuit in response to a selection signal generated by the selection signal generator of FIG. 2. Specifically, FIG. 3 shows waveforms of a first division output signal OUTA1 obtained by 1/2-dividing an external clock signal EXTCLK and a second division output signal OUTA2 obtained by 1/2-dividing the first division signal OUTA1, in response to selection signals A1, A2 of the selection signal generator 360.

The operation of the selection signal generator 360, the first dividing circuit 310, and the second dividing circuit 320 and waveforms of output signals of the first dividing circuit 310 will now be described with reference to FIGS. 2 and 3.

A process of 1/4-dividing an external clock signal EXTCLK and outputting the $1/4^N$-divided external clock signal EXTCLK as a second division output signal OUTA2 using only the first divider 311-1, the first MUX 312-1, the second divider 311-2, the second MUX 312-2, the bit signal generator 361, the first D flip-flop 365-1, and the second D flip-flop 365-2 will now be described as an example. In this case, N is 2, however, N may be an integer greater than or equal to one.

Here, it is assumed that both first and second selection signals A1 and A2 output by the first D flip-flop 365-1 and the second D flip-flop 365-1 are initially set to a state '0'.

When the first divider 311-1 receives the external clock signal EXTCLK, 1/2-divides the external clock signal EXTCLK, and outputs a positive output signal Q and a negative output signal /Q, the first MUX 312-1 may select the positive output signal Q of the first divider 311-1 in response to the first selection signal A1 of the first D flip-flop 365 and output the positive output signal Q of the first divider 311-1 as a first division output signal OUTA1.

When the second divider 311-2 receives the first division output signal OUTA1, 1/2-divides the first division output signal OUTA1, and outputs a positive output signal Q and a negative output signal /Q, the second MUX 312-2 may select the positive output signal Q of the second divider 311-2 in response to the second selection signal A2 of the second D flip-flop 365-2 and output the positive output signal Q of the second divider 311-2 as a second division output signal OUTA2.

In this case, it is assumed that when the first and second selection signals A1 and A2 output by the first and second D flip-flops 365-1 and 365-2 are in the states '0' and '0', respectively, the second division output signal OUTA2 is 1/4-divided at a first edge E(N)-1 of the external clock signal EXTCLK.

Thereafter, when the bit signal generator 361 outputs state '1' of the bit signal BS in response to a selection clock signal CLK, the first D flip-flop 365-1 may output state '1' of first selection signal A1 in response to a next selection clock signal CLK, and the first MUX 312-1 may output the negative output signal /Q of the first divider 311-1 in response to the state '1' of the first selection signal A1.

Simultaneously, the second D flip-flop 365-2 may output '0', which is a previous first selection signal A1 of the first D flip-flop 365-1, as a second selection signal A2. Thus, the second MUX 312-2 may continuously select and output the positive output signal Q of the second divider 311-2. The bit signal generator 361 may select one of '0' and '1' at random and output the selected one as a next state of the bit signal BS.

Accordingly, since the first and second selection signals A1 and A2 output by the first and second D flip-flops 365-1 and 365-2 are changed from states '0' and '0' into states '1' and '0', the first division output signal OUTA1 may be changed from the positive output signal Q into the negative output signal /Q and the second division output signal OUTA2 may remain the positive output signal Q. As a result, a second division output signal OUTA2, which is 1/4-divided at a second edge E(N)-2 delayed by a clock, may be output. This is unlike the second division output signal OUTA2 divided at the first edge E(N)-1 of the external clock signal EXTCLK, which is output when the first and second selection signals A1 and A2 output by the first and second D flip-flops 365-1 and 365-2 are in the states '0' and '0', respectively.

Subsequently, when the bit signal generator 361 outputs state '0' of bit signal BS, the first D flip-flop 365-1 may output state '0' of first selection signal A1 in response to a next selection clock signal CLK, and the first MUX 312-1 may select and output the positive output signal Q of the first divider 311-1 in response to the state '0' of the first selection signal A1.

Simultaneously, the second D flip-flop 365-2 may output '1', which is a previous first selection signal A1 of the first D flip-flop 365, as a second selection signal A2. Thus, the second MUX 314 may continuously select and output the negative output signal /Q of the second divider 311-2. The bit signal generator 361 may select one of '0' and '1' at random and output the selected one as a next state of the bit signal BS.

Accordingly, since the first and second selection signals A1 and A2 output by the first and second D flip-flops 365-1 and 365-2 are changed from states '1' and '0' into states '0' and '1', the first division output signal OUTA1 may be changed from the negative output signal /Q into the positive output signal Q and the second division output signal OUTA2 may be changed from the positive output signal Q into the negative output signal /Q. As a result, a second division output signal OUTA2, which is 1/4-divided at a third edge E(N)-3 delayed by a clock, may be output. This is unlike the second division output signal OUTA2 divided at the second edge E(N)-2 of the external clock signal EXTCLK, which is output when the first and second selection signals A1 and A2 output by the first and second D flip-flops 365-1 and 365-2 are in the states '1' and '0', respectively.

Subsequently, the bit signal BS of the bit signal generator 361 and the first and second selection signals A1 and A2 of the first and second D flip-flops 365-1 and 365-2 will be continuously changed in response to the selection clock signal CLK.

When the selection signal generator 360 operates as described above, output signals of the bit signal generator 361 and the first and second D flip-flops 365-1 and 365-2 may be varied as shown in Table 1.

TABLE 1

| Random signal generator (random output) | First D flip-flop | Second D flip-flop |
|---|---|---|
| 1 | 0(initial state) | 0(initial state) |
| 0 | 1 | 0 |
| 1 | 0 | 1 |
| 1 | 1 | 0 |
| 0 | 1 | 1 |
| 0 | 0 | 1 |
| 1 | 0 | 0 |

In the above-described operation, the first division output signal OUTA1 may be obtained by 1/2-dividing the external clock signal EXTCLK, and the second division output signal OUTA2 may be obtained by 1/4-dividing the external clock signal EXTCLK. Also, since the positive output signal Q and the negative output signal /Q of the first and second dividers 311-1 and 311-2 are selected in response to a plurality of selection signals A1 to A(N) of the selection signal generator 360, an edge of the external clock signal EXTCLK may be periodically selected at random, and the division output signal OUTA2 may be 1/4-divided and output based on the selected edge of external clock signal EXTCLK.

In summary, when the first MUX 312-1 outputs the positive output signal Q in response to state '0' of the first selection signal A1 and the second MUX 312-2 outputs the positive output signal Q in response to state '0' of the second selection signal A2, the second division output signal OUTA2 may correspond to a clock signal obtained by 1/4-dividing the external clock signal EXTCLK at the first edge E(N)-1.

When the first MUX 312 outputs the positive output signal Q in response to state '1' of the first selection signal A1 and the second MUX 314 outputs the negative output signal /Q in response to state '0' of the second selection signal A2, the second division output signal OUTA2 may be a clock signal obtained by 1/4-dividing the external clock signal EXTCLK at the second edge E(N)-2. Also, when the first MUX 312-1 outputs the positive output signal Q in response to state '0' of the first selection signal A1 and the second MUX 312-2 outputs the negative output signal /Q in response to state '1' of the second selection signal A2, the second division output signal OUTA2 may be a clock signal obtained by 1/4-dividing the external clock signal EXTCLK at the third edge E(N)-3.

When the first MUX 312-1 outputs the negative output signal /Q in response to state '1' of the first selection signal A1 and the second MUX 312-2 outputs the positive output signal Q in response to state '0' of the second selection signal A2, the second division output signal OUTA2 may be a clock signal obtained by 1/4-dividing the external clock signal EXTCLK at the second edge E(N)-2. Also, when the first MUX 312-1 outputs the negative output signal Q in response to state '1' of the first selection signal A1 and the second MUX 312-2 outputs the negative output signal /Q in response to state '1' of the second selection signal A2, the second division output signal OUTA2 may be a clock signal obtained by 1/4-dividing the external clock signal EXTCLK at the fourth edge E(N)-4.

While the second divider 311-2 was described as 1/4-dividing the external clock signal EXTCLK, it may also be said that the second divider 311-2 1/2-divides the first division output signal OUTA1.

Although a description of the internal clock signal INTCLK is omitted, an edge of the internal clock signal INTCLK may be selected in response to first and second selection signals A1 and A2 and the internal clock signal INTCLK may be divided at a selected edge by the second dividing circuit 320.

As described above, the first and second dividing circuits 310 and 320 according to the example embodiment may select edges of the external clock signal EXTCLK and the internal clock signal INTCLK in response to the first and second selection signals A1 and A2 and divide the external clock signal EXTCLK and the INTCLK based on the selected edges.

Here, when the selection clock signal CLK required for generating the first and second selection signals A1 and A2 has a high frequency, a system may rapidly respond to periodic noise, but current consumption may increase. Also, when the selection clock signal CLK has a low frequency, the system may not rapidly respond to periodic noise. Accordingly, a designer may set the frequency of the selection clock signal CLK in consideration of a correlation between current consumption and the response of the system. For example, the frequency of the selection clock signal CLK may be as low as possible to lessen current consumption.

Figure 4:
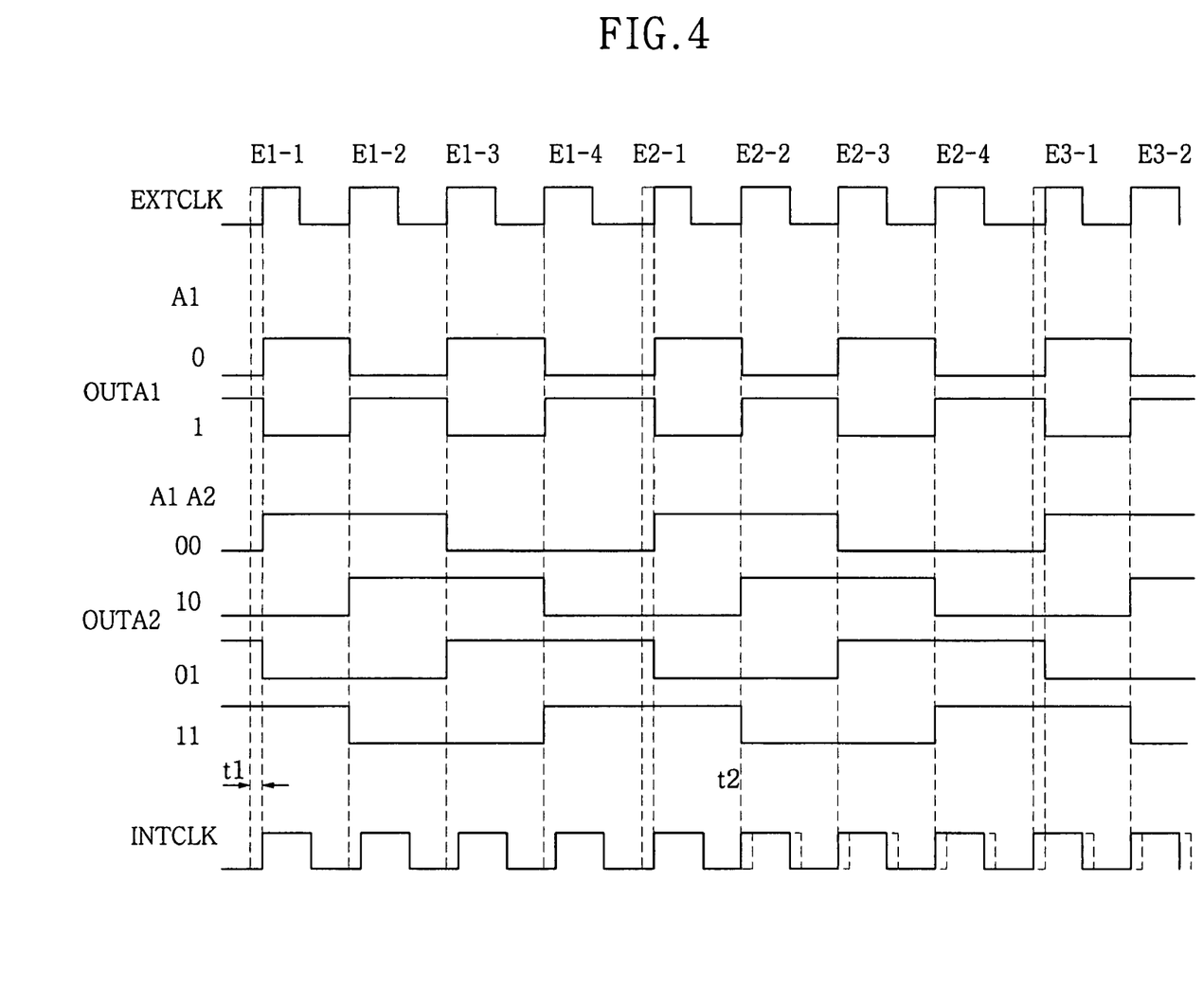
FIG. 4 is a signal waveform diagram for explaining operation of the PLL shown in FIG. 1.

FIG. 4 is a signal waveform diagram for explaining operation of the PLL shown in FIG. 1.

The operation and waveforms of output signals of the PLL according to the present example embodiment will now be described with reference to FIGS. 1, 2 and 4.

The first dividing circuit 310 may receive an external clock signal EXTCLK and an internal clock signal INTCLK, which is an output signal of the VCO 50 fed back to the second dividing circuit 320. Thereafter, the first and second dividing circuits 310 and 320 may divide the external clock signal EXTCLK and the internal clock signal INTCLK by respective division ratios and output a division frequency signal Fref and a comparison frequency signal Cref, respectively. As will be recalled, the respective division ratios may be a same ratio.

In this case, the first and second dividing circuits 310 and 320 may select specific cyclic edges of the external clock signal EXTCLK and the internal clock signal INTCLK, respectively, and divide the external clock signal EXTCLK and the internal clock signal INTCLK by the respective division ratios. Specifically, the first dividing circuit 310 may change a selected specific edge into one of the edges of the external clock signal EXTCLK in response to an output signal of the selection signal generator 360 during one cycle of a division frequency signal and output the division frequency signal Fref, which is obtained by dividing the external clock signal EXTCLK based on the changed edge. Also, the second dividing circuit 320 may change a selected specific edge into one of the edges of the internal clock signal INTLCK in response to the output signal of the selection signal generator 360 during one cycle of a comparison frequency signal and output the comparison frequency signal Cref, which is obtained by dividing the internal clock signal INTLCK based on the changed edge.

Thereafter, the PFD 30 may compare the two signals Fref and Cref and generate an up signal or a down signal corresponding to a phase difference between the two signals Fref and Cref. Also, the charge pump and loop filter 40 may regulate the level of a control voltage Vco for controlling the frequency of the internal clock signal INTCLK in response to the up signal or down signal of the PFD 30, so that the internal clock signal INTCLK output by the VCO 50 can be varied. By repeating the above-described process, the internal clock signal INTCLK may be synchronized with the external clock signal.

FIG. 4 shows the waveform of an output signal of the PLL, which is obtained by 1/4-dividing an input signal and comparing with the input signal, according to an example embodiment. Specifically, when noise occurs in a first edge E(N)-1 of an external clock signal EXTCLK, variations of a first division output signal OUTA1 of the first MUX 312-1, a second division output signal OUTA2 of the second MUX 312-2, and an internal clock signal INTCLK in the first dividing circuit 310 are shown in FIG. 4.

Here, since the PLL uses 1/4-division, a division frequency signal Fref of the first dividing circuit 310 may be the second division output signal OUTA2.

When periodic noise occurs in the first edge E(N)-1 of the external clock signal EXTCLK, the external clock signal EXTCLK may be delayed by a noise generation time t1 under the influence of the noise and thus, the first division output signal OUTA1 may be delayed by the noise generation time t1 at the first edge E(N)-1 of the external clock signal EXTCLK.

In this case, both first and second selection signals A1 and A2 of the selection signal generator 360 may be set to a state '0' initially.

Since the first division output signal OUTA1 is delayed, the second division output signal OUTA2 may be also delayed, so that the division frequency signal Fref of the first dividing circuit 310 may be delayed. Accordingly, the internal clock signal INTCLK may be delayed by the noise generation time t1 and output in synchronization with the delayed division frequency signal Fref.

After that, the selection signal generator 360 may output the first and second selection signals A1 and A2 being in states '1' and '0', respectively, in response to the transition of a selection clock signal CLK at time t2. The first and second MUXs 312-1 and 312-2 of the first dividing circuit 310 may output the first division output signal OUTA1, which is divided based on a noiseless second edge E(N)-2 in response to the first selection signal A1, and the second MUXs 312-2 outputs the second division output signal OUTA2 in response to the first division output signal OUTA1 and the second selection signal A2.

Accordingly, the internal clock signal INTCLK may be synchronized with the division frequency signal Fref, which is divided based on the noiseless second edge E(N)-2 of the external clock signal EXTCLK, and synchronized with the external clock signal EXTCLK.

In general, a 1/4 divider may output a divided clock signal based on the first edge E(N)-1 of the external clock signal EXTCLK. However, according to the example embodiments, four states may be set to reflect the first through fourth edges E(N)-1 to E(N)-4 of the external clock signal EXTCLK, one of the four states may be periodically selected at random, and a divided clock signal may be output based on the selected state. As a result, the divided clock signal may be output based on each of the edges of the external clock signal EXTCLK.

Although a 1/4-dividing circuit is described as an example according to the above example embodiments, any 1/N-dividing circuit may also be used. Namely, N may be an integer greater than or equal to one.

A dividing circuit and a PLL using the same according to the example embodiments may select a positive output signal or a negative output signal of each of a plurality of dividers at random and generate a division signal. Thus, the possibility of reflection of a specific edge in which noise occurs in the dividing circuit may be reduced. As a result, the influence of periodic noise that occurs in the specific edge can be lessened, thereby improving the stability of the dividing circuit.

A PLL according to the example embodiments can periodically select one of the edges of a input signal during one cycle of division signal at random, generate the division signal based on the selected edge of the input signal and output a signal based on the division signal, and compare the output signal with the input signal. As a result, the influence of periodic noise that may occur at the specific edge of the input signal can be reduced, thereby improving the stability of the dividing circuit.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A phase locked loop (PLL) comprising:
    a selection signal generator configured to output a selection signal varying in response to a first clock signal;
    a first dividing circuit configured to divide an input clock signal by first division ratio and output a first division signal, the first dividing circuit configured to select one of a plurality of edges of the input clock signal applied during at least one cycle of the first division signal in response to the selection signal, and to synchronize and generate the first division signal on the basis of the selected edge of the input clock signal;
    a second dividing circuit configured to receive an output clock signal, divide the output clock signal by second division ratio, and output a second division signal, the second dividing circuit configured to select one of the edges of the output clock signal applied during at least one cycle of the second division signal in response to the selection signal, and to synchronize and generate the second division signal on the basis of the selected edge of the output clock signal; and
    a synchronous signal output portion configured to detect a phase difference between the first and second division signals, generate a control voltage corresponding to the phase difference, and output the output clock signal having a frequency corresponding to the control voltage.

2. The PLL of claim 1, wherein the first division ratio and the second division ratio are a same division ratio.

3. The PLL of claim 2, wherein the first dividing circuit includes a number of division output units connected in cascade, the number being at least one, and each of the division output units including,
    a divider configured to output a positive output signal and a negative output signal corresponding to an inverse of the positive output signal, the positive output signal obtained by one-half dividing the input clock signal or a positive output signal of a previous division output unit, and
    a multiplexer (MUX) configured to select and output one of the positive output signal and the negative output signal in response to the selection signal.

4. The PLL of claim 3, wherein the divider is a flip-flop.

5. The PLL of claim 1, wherein the second dividing circuit a number of division output units connected in cascade, the number being at least one, and each of the division output units including,
    a divider configured to output a positive output signal and a negative output signal corresponding to an inverse of the positive output signal, the positive output signal obtained by one-half dividing the input clock signal or a positive output signal of a previous division output unit, and
    a multiplexer (MUX) configured to select and output one of the positive output signal and the negative output signal in response to the selection signal.

6. The PLL of claim 5, wherein the divider is a flip-flop.

7. The PLL of claim 1, wherein the selection signal generator includes:
    a bit signal generator configured to generate a bit signal in response to the first clock signal; and
    at least one flip-flop connected in series and configured to generate the selection signal,
    wherein a first of the flip-flops connected in series receives the bit signal in response to the first clock signal, and each of remaining flip-flops connected in series receives an output signal from a previous flip-flop of the flip flops connected in series.

8. The PLL of claim 7, wherein the flip-flop is a D flip-flop.

9. The PLL of claim 7, wherein the bit signal is generated at random.

10. The PLL of claim 1, wherein the selection signal generator includes a bit signal generator configured to generate and output at least one selection signal in response to the first clock signal.

11. The PLL of claim 10, wherein the selection signal is generated at random.

12. The PLL of claim 1, wherein the first clock signal is a clock signal with a lower frequency than that of the input clock signal.

13. The PLL of claim 1, wherein the synchronous signal output portion includes:
    a phase frequency detector (PFD) configured to output an up signal or a down signal in response to a phase difference between the first and second division signals;
    a charge pump and loop filter configured to output the control voltage corresponding to the up signal or the down signal; and
    a voltage controlled oscillator (VCO) configured to output the output signal having a frequency corresponding to the control voltage.

* * * * *